(12) United States Patent
Schuh et al.

(10) Patent No.: US 6,555,849 B1
(45) Date of Patent: Apr. 29, 2003

(54) DEACTIVATABLE THYRISTOR

(75) Inventors: Gottfried Schuh, Augsburg (DE); Hans-Joachim Schulze, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/711,847

(22) Filed: Nov. 13, 2000

Related U.S. Application Data

(63) Continuation of application No. PCT/DE99/01366, filed on May 6, 1999.

(30) Foreign Application Priority Data

May 12, 1998 (DE) .......................................... 198 21 240

(51) Int. Cl.[7] .......................... H01L 29/94; H01L 29/76
(52) U.S. Cl. ....................... 257/130; 257/173; 257/155
(58) Field of Search ................................ 257/173, 155, 257/130

(56) References Cited

U.S. PATENT DOCUMENTS

| | | | |
|---|---|---|---|
| 5,420,461 A | | 5/1995 | Mallik et al. |
| 5,479,031 A | * | 12/1995 | Webb et al. |
| 5,705,835 A | * | 1/1998 | Nishiura et al. |
| 5,706,174 A | | 1/1998 | Distefano |
| 5,731,605 A | * | 3/1998 | Schlangenotto et al. |
| 5,753,973 A | | 5/1998 | Yasunaga et al. |
| 5,904,498 A | | 5/1999 | Fjelstad |
| 5,989,936 A | | 11/1999 | Smith et al. |
| 6,064,086 A | * | 5/2000 | Nakagawa et al. |
| 6,180,965 B1 | * | 1/2001 | Terasawa |
| 6,218,682 B1 | * | 4/2001 | Zucker |

FOREIGN PATENT DOCUMENTS

| | | |
|---|---|---|
| DE | 111383 A1 * | 11/1991 |
| DE | 44 03 916 A1 | 9/1994 |
| DE | 197 23 203 a1 | 1/1998 |
| DE | 196 40 242 C2 | 4/1998 |
| EP | 254910 A1 * | 7/1987 |
| EP | 0 833 390 A2 | 4/1998 |
| JP | 04 010 543 A | 1/1992 |
| JP | 05 175 199 A | 7/1993 |
| WO | WO 96/14659 | 5/1996 |

\* cited by examiner

*Primary Examiner*—Stephen D. Meier
(74) *Attorney, Agent, or Firm*—Laurence A. Grenberg; Werner H. Stemer; Ralph E. Locher

(57) ABSTRACT

A thyristor includes a semiconductor body having a first emitter layer and a first base layer on an anode side, a second base layer and a second emitter layer on a cathode side, a cathode contact, and an electrically insulating insulation layer having openings. The insulation layer is disposed between the second emitter layer and the cathode contact. The openings have dimensions and spacings making the insulation layer form an electrical resistor for reducing current filamentation. A series resistor is incorporated on the cathode side and is formed by the pierced insulation layer between the cathode side metallizing, forming the terminal contact, and the doped semiconductor material of the emitter on the cathode side. The openings are preferably cylindrical. In a silicon component element, the insulation layer preferably is $SiO_2$ or $Si_3N_4$, or a layered succession of $SiO_2$ and $Si_3N_4$.

11 Claims, 1 Drawing Sheet

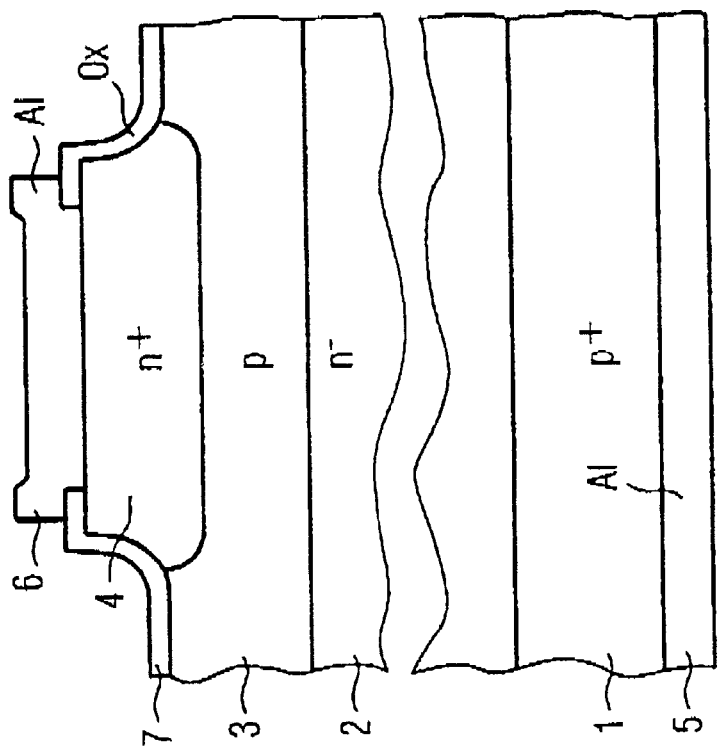
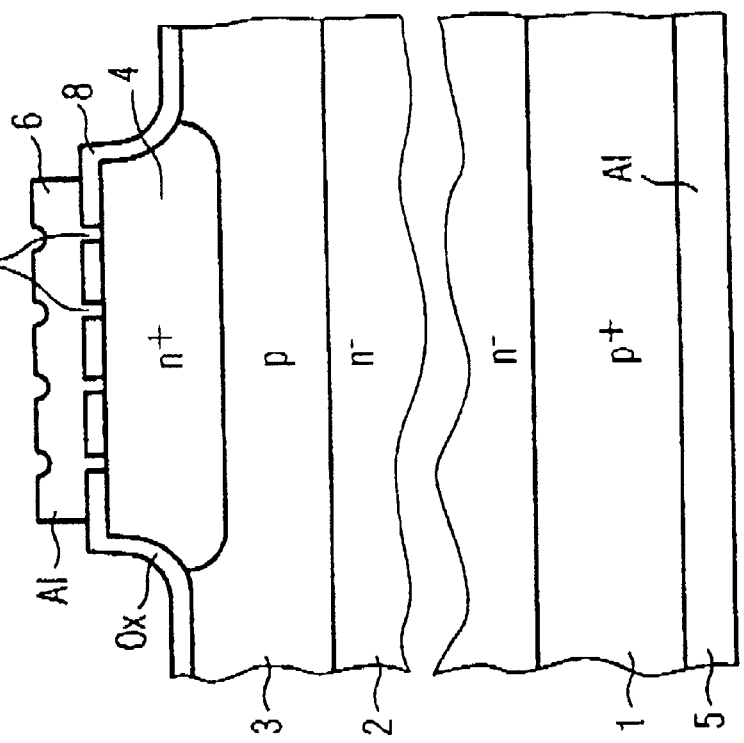

DEACTIVATABLE THYRISTOR

This a continuation of application Ser. No. PCT/DE99/01366, filed May 6, 1999.

BACKGROUND OF THE INVENTION

FIELD OF THE INVENTION

The present invention relates to a deactivatable thyristor, in which the filamentation during the deactivation operation is averted.

Deactivatable thyristors tend to filamentation during the deactivation operation, because they include a very great number of parallel-connected single thyristors. The causes of these filamentations are lateral discontinuities in the component element, which can for instance be due to the finite conductivity of the metallizing on the cathode side, to nonhomogeneous distributions of the dopant profiles and of the substrate service life, to nonhomogeneous pressure contacting, or to nonhomogeneous etched features. Because of the current filamentation, the maximum current that the component element is capable of turning off without destruction is severely reduced.

This filamentation can be reduced considerably by using series resistors, since the voltage drop established along these series resistors counteracts the filamentation. However, care must be taken that this voltage drop not become too great; otherwise the on-state voltage of the component elements rises too sharply. In principle, series resistors can be embodied by depositing polysilicon on the emitter on the cathode side. However, this is technologically complex, and there are narrow limits to the range within which the resistor can be adjusted.

SUMMARY OF THE INVENTION

The object of the present invention is to disclose a deactivatable thyristor in which the effects caused by filamentation are largely avoided.

This object is attained with the thyristor having a semiconductor body, with an emitter layer on the anode side, a base layer on the anode side, a base layer on the cathode side, and an emitter layer on the cathode side, in which an electrically insulating insulation layer, which has openings, is present between the emitter layer on the cathode side and a cathode contact applied over it; and in which the dimensions and spacings of these openings are selected such that the insulation layer forms an electrical resistor for reducing current filamentation.

In the thyristor according to the invention, a series resistor is incorporated on the cathode side. The series resistor is formed by a pierced insulation layer between the metallizing on the cathode side, which forms the terminal contact, and the doped semiconductor material of the emitter on the cathode side. The openings in this insulation layer are preferably cylindrical. In a component element comprising silicon, the insulation layer preferably comprises $SiO_2$ or $Si_3N_4$, or a layered succession of $SiO_2$ and $Si_3N_4$.

BRIEF DESCRIPTION OF THE DRAWINGS

A more detailed description of the thyristor according to the invention follows in conjunction with FIGS. 1 and 2, which respectively show a thyristor according to the invention and a conventional thyristor in cross section.

DESCRIPTION OF THE PREFERRED EMBODIMENTS

In FIG. 2, a conventional design of a thyristor is shown in cross section. An emitter layer 1 on the anode side, a base layer 2 on the anode side, a base layer 3 on the cathode side, and an emitter layer 4 on the cathode side follow in succession. The emitter layers are provided with an anode contact 5 and with a cathode contact 6. A contact for the (P-doped) base layer 3 on the cathode side, which acts as a gate for controlling the thyristor, has been omitted from the drawing for the sake of simplicity; it is mounted in the usual way in the thyristor. For the sake of better contacting, the emitter layers are preferably highly enough doped to form an ohmic metal-to-semiconductor contact. As an alternative, there can be additional highly doped contact layers of semiconductor material, or the emitter layers each have a dopant concentration that increases toward the contact 5, 6.

In the typical embodiment of such a thyristor, of the kind shown in FIG. 2, the PN junction on the cathode side is carried to the top of the component element, that is, the side toward the cathode, where it is preferably passivated with an electrically insulating layer. An insulation layer 7 of this kind is shown in FIG. 2 laterally of the cathode contact 6. The component element is preferably rotationally symmetrical, so that the contact area between the cathode contact 6 and the semiconductor material of the emitter on the cathode side is bounded by a circle.

FIG. 1 shows a corresponding cross section through a thyristor according to the invention. The emitter layer 1 on the anode side, the base layer 2 on the anode side, the base layer 3 on the cathode side, and the emitter layer 4 on the cathode side are present as usual. An anode contact 5 and a cathode contact 6 are applied to the respective emitter layers. Unlike the conventional design of the thyristor, however, here a series resistor is incorporated on the cathode side. To that end, an insulation layer 8 of an electrically insulating material, such as $Sio_2$ or $Si_3N_4$, is applied to the top, that is, the side toward the cathode, of the semiconductor body of the thyristor. The contacting of the emitter layer 4 on the cathode side is done through openings 9, preferably cylindrical holes, in the insulation layer 8. The cathode contact 6 is applied above the insulation layer 8, so that the metal (for instance aluminum, as shown in the drawing) of the cathode contact 6 is in contact, in the region of the openings 9 in the insulation layer 8, with the semiconductor material of the emitter layer 4 on the cathode side.

The size of the series resistor can be established by the selection of the dimensions of the openings 9 in the insulation layer 8 (such as the diameter of the cylinder) and by a suitable definition of the spacings of these openings from one another. The openings are preferably produced by photolithography; by means of a photo mask, openings of the dimensions specified by how the mask is embodied are etched out of the insulation layer, which initially is produced over the entire surface.

On the cathode side, a plurality of cathode contacts may be present on a plurality of parallel, striplike emitter layers (emitter prongs). Especially if the dimensions of the openings 9 are small, along with small mutual spacings, not only can the filamentation over the entire surface of such a thyristor be reduced, but the current filamentation at each individual emitter prong can also be reduced. If the dimensions of the openings are small, there is furthermore the effect that the resistance in the contact metal inside the opening increases by constriction of the electrical field lines.

What is claimed is:

1. A thyristor, comprising:
   a semiconductor body having:
      an anode side;
      a cathode side;

a first emitter layer on said anode side;
a first base layer on said anode side;
a second base layer on said cathode side; and
a second emitter layer on said cathode side;
a cathode contact;
an electrically insulating insulation layer having openings;
said insulation layer disposed between said second emitter layer and said cathode contact; and
said openings having dimensions and spacings to form an electrical resistor for reducing current filamentation from said insulation layer.

2. The thyristor according to claim 1, wherein said second emitter layer and said cathode contact contact one another through said openings in said insulation layer.

3. The thyristor according to claim 1, wherein:
said second emitter layer has emitter prongs; and
said cathode contact has parts; and each of said emitter prongs contacts one of said parts of said cathode contact through said openings in said insulation layer.

4. The thyristor according to claim 1, wherein said second emitter layer has extensions and each of said extensions contacts said cathode contact through a respective one of said openings in said insulation layer.

5. The thyristor according to claim 1, wherein said cathode contact has extensions and each of said extensions contacts said second emitter layer through a respective one of said openings in said insulation layer.

6. The thyristor according to claim 1, wherein said openings are cylindrical.

7. The thyristor according to claim 1, wherein
said semiconductor body has an upper surface at said cathode side;
said second base layer and said second emitter layer define a boundary layer and said boundary layer extends toward said upper surface; and
said insulation layer is a passivation for said boundary face on said upper surface.

8. The thyristor according to claim 1, wherein said insulation layer is made from at least one of $SiO_2$ and $Si_3N_4$.

9. The thyristor according to claim 1, wherein said insulation layer has layered plies.

10. The thyristor according to claim 1, wherein said layered plies are made from a material selected from the group consisting of $SiO_2$ and $Si_3N_4$.

11. The thyristor according to claim 1, wherein said layered plies are made from a layered succession of $SiO_2$ and $Si_3N_4$.

* * * * *